(12) United States Patent
Momii et al.

(10) Patent No.: US 7,257,044 B2
(45) Date of Patent: Aug. 14, 2007

(54) SEMICONDUCTOR INTEGRATED CIRCUIT

(75) Inventors: Masato Momii, Chitose (JP); Naoki Yada, Tokorozawa (JP); Masaru Iwabuchi, Sagamihara (JP)

(73) Assignee: Renesas Technology Corp., Tokyo (JP)

( * ) Notice: Subject to any disclaimer, the term of this patent is extended or adjusted under 35 U.S.C. 154(b) by 97 days.

(21) Appl. No.: 11/265,105

(22) Filed: Nov. 3, 2005

(65) Prior Publication Data
US 2006/0120190 A1 Jun. 8, 2006

(30) Foreign Application Priority Data
Nov. 11, 2004 (JP) ............................ 2004-327192

(51) Int. Cl.
*G11C 17/18* (2006.01)
(52) U.S. Cl. ...................... 365/225.7; 365/96
(58) Field of Classification Search ............. 365/225.7, 365/96, 210
See application file for complete search history.

(56) References Cited

U.S. PATENT DOCUMENTS

| 6,330,204 | B1 * | 12/2001 | Miyagi | ..................... 365/225.7 |
| 6,704,236 | B2 * | 3/2004 | Buer et al. | ............... 365/225.7 |
| 6,995,601 | B2 * | 2/2006 | Huang et al. | ............... 327/525 |
| 7,110,313 | B2 * | 9/2006 | Huang | ..................... 365/225.7 |

* cited by examiner

*Primary Examiner*—Anh Phung
(74) *Attorney, Agent, or Firm*—Miles & Stockbridge PC

(57) ABSTRACT

There is provided a fuse module that holds trimming information for an internal oscillation circuit module. The fuse module includes information-writing fuse circuits to which trimming information is written depending on whether an information-writing fuse is blown; a reference fuse circuit for determining whether the information-writing fuse has been blown; and a current-to-voltage converter section. Since the reference fuse circuit and the current-to-voltage converter section are shared by the information-writing fuse circuits, the circuit area of the fuse module is greatly reduced.

6 Claims, 4 Drawing Sheets

SEMICONDUCTOR INTEGRATED CIRCUIT

CROSS-REFERENCE TO RELATED APPLICATION

The present application claims priority from Japanese patent application No. 2004-327192 filed n Nov. 11, 2004, the content of which is hereby incorporated by reference into this application.

BACKGROUND OF THE INVENTION

1. Field of the Invention

The present invention relates to a technique of trimming for a semiconductor integrated circuit, and in particular, it relates to a technique suitable for holding trimming information for use in an oscillation circuit that generates a clock signal.

2. Description of the Related Art

Well-known semiconductor integrated circuits such as microcomputers synthesized by clock pulses generate clock signals with an oscillation circuit having a crystal oscillator in the semiconductor integrated circuit not on the outside.

Some of these semiconductor integrated circuits have a trimming circuit that prevents variations in oscillation frequency generated by the oscillation circuit due to the variations of the process, fluctuations in supply voltage, or temperature changes (e.g., U.S. application Ser. No. 11/188873).

In this case, the trimming circuit includes a trimming fuse circuit capable of storing control information generated by a logic circuit that generates control information for matching the frequency of an external clock signal generated externally with that of an internal clock signal.

The trimming fuse circuit includes an information-writing blow fuse that allows writing of control information depending on whether to be blown; and a reference blow fuse equivalent to the unblown condition of the information-writing blow fuse. The trimming fuse circuit compares a current flowing in the information-writing blow fuse to a current flowing in the reference blow fuse to determine whether the information-writing blow fuse has been blown, thereby obtaining trimming information.

The inventor has found that the above-described trimming technique for the semiconductor integrated circuit has the following problems.

To trim the oscillation frequency of a clock signal with high accuracy, trimming information of multiple bits is required. For 8-bit trimming information, for example, eight trimming fuse circuits are required.

Correspondingly, the numbers of the information-writing blow fuses and the reference blow fuses also increase, resulting in an increase in the chip area occupied by the trimming fuse circuit. This may inhibit size reduction of a semiconductor integrated circuit.

SUMMARY OF THE INVENTION

Accordingly, it is an object of the invention to provide a technique of reducing the area of the circuit of control-information holding means for holding control information used in trimming of an analog circuit etc., thereby decreasing the chip area of a semiconductor integrated circuit.

The foregoing and other objects and novel features of the invention will be apparent from the description and appended drawings of this specification.

A typical example of the invention disclosed herein will be briefly summarized below.

A semiconductor integrated circuit according to an aspect of the invention includes a control-information holding module that holds arbitrary bits of control information. The control-information holding module includes a control-information writing section that arbitrarily outputs the control information written for each bit in response to a first control signal; a reference-information output section that outputs reference information in response to a second control signal; a control-information output section that compares the control information for each bit output from the control-information writing section to the reference information output from the reference-information output section to determine for each bit whether the control information is at a low level or a high level, and outputs the comparison result; and a storage section that stores the control information output from the control-information output section.

It is preferable that the control-information writing section include control-information-writing fuses provided by the number equivalent to the bits of the control information, for writing the control information; and a first switching element provided for each of the control-information-writing fuses and connected between the control-information-writing fuses and the control-information output section, for switching in response to the first control signal. It is preferable that the reference-information output section include a reference fuse for determining whether control information has been written to the control-information-writing fuses; and a second switching element connected between the reference fuse and the control-information output section, for switching in response to the second control signal.

It is preferable that the control-information-writing fuses and the reference fuse include a blow fuse that is blown by application of voltage.

It is preferable that the control-information output section includes a first current-to-voltage converter section that converts a current flowing in the control-information-writing fuses of the number equivalent to the arbitrary bits to voltage; a second current-to-voltage converter section that converts a current flowing in the reference fuse to voltage; and a comparing section that compares the levels of the voltages converted by the first and second current-to-voltage converter sections, and outputs the comparison result.

It is preferable that the storage section be a register accessible by a central processing unit.

It is preferable that the control information held by the control-information holding module be used as a trimming signal for an oscillation circuit that generates an internal clock signal.

The advantages offered by a typical example of the invention are as follows:

(1) Minimizing control-information holding means, thus reducing the area of the chip;

(2) Minimizing a semiconductor integrated circuit while increasing the reliability owing to (1).

DESCRIPTION OF THE PREFERRED EMBODIMENT

Figure 1:
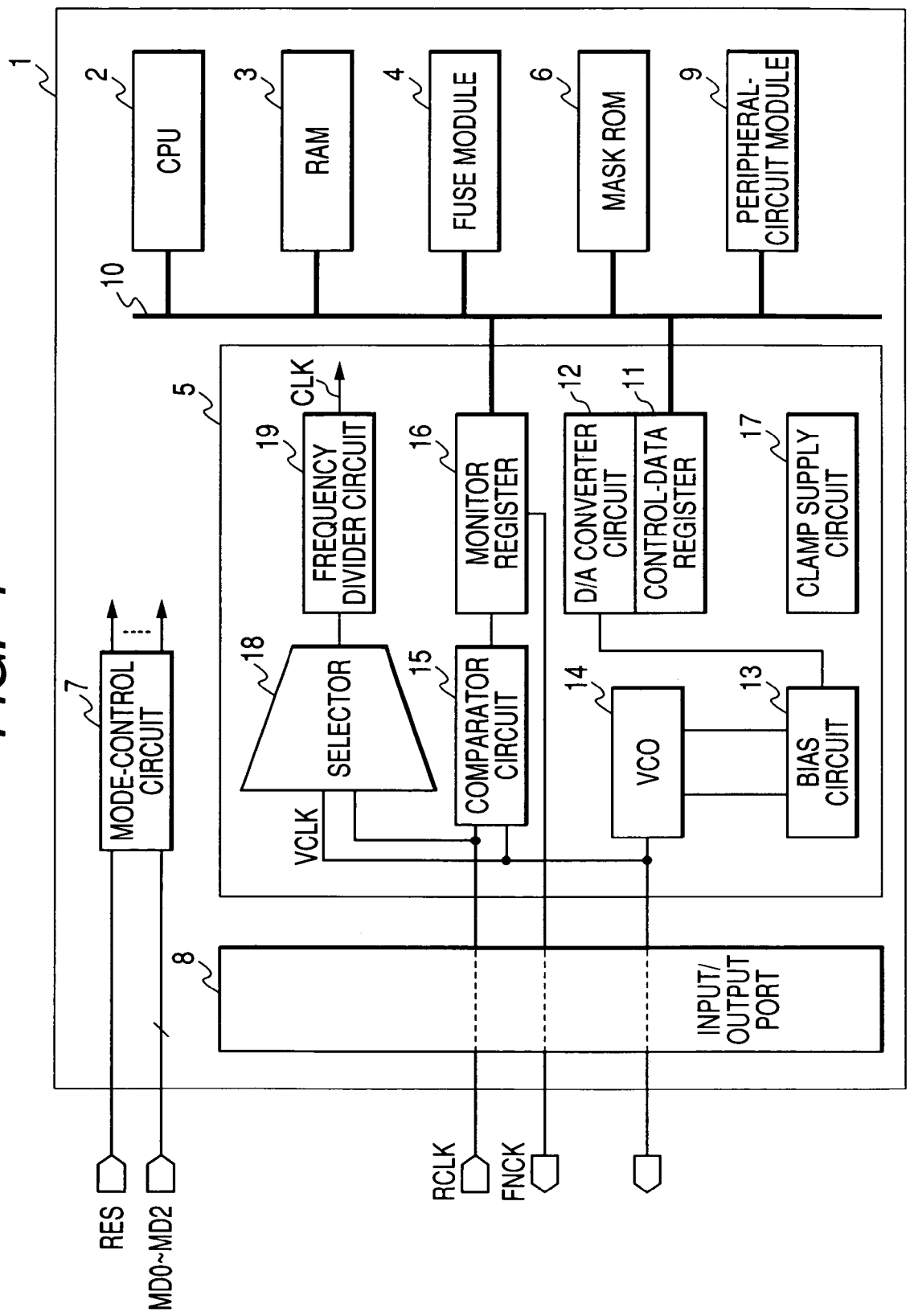
FIG. 1 is a block diagram of a semiconductor integrated circuit according to an embodiment of the invention.

An embodiment of the invention will be specifically described with reference to the drawings. In all the drawing, the same components are given the same reference numerals and their further description will be omitted.

Figure 2:
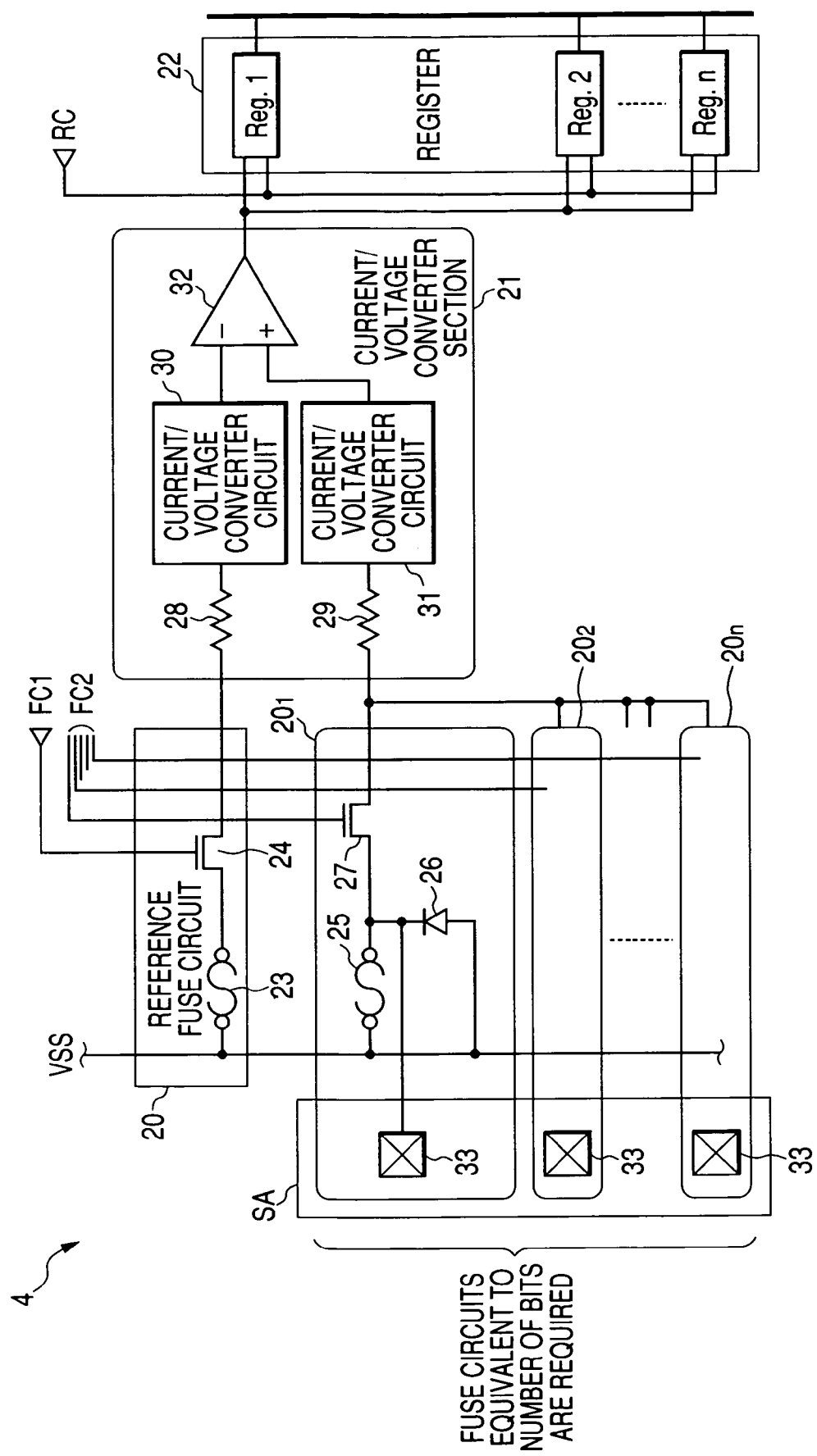
FIG. 2 is a block diagram of an example of a fuse module disposed in the semiconductor integrated circuit of FIG. 1.
Figure 3:
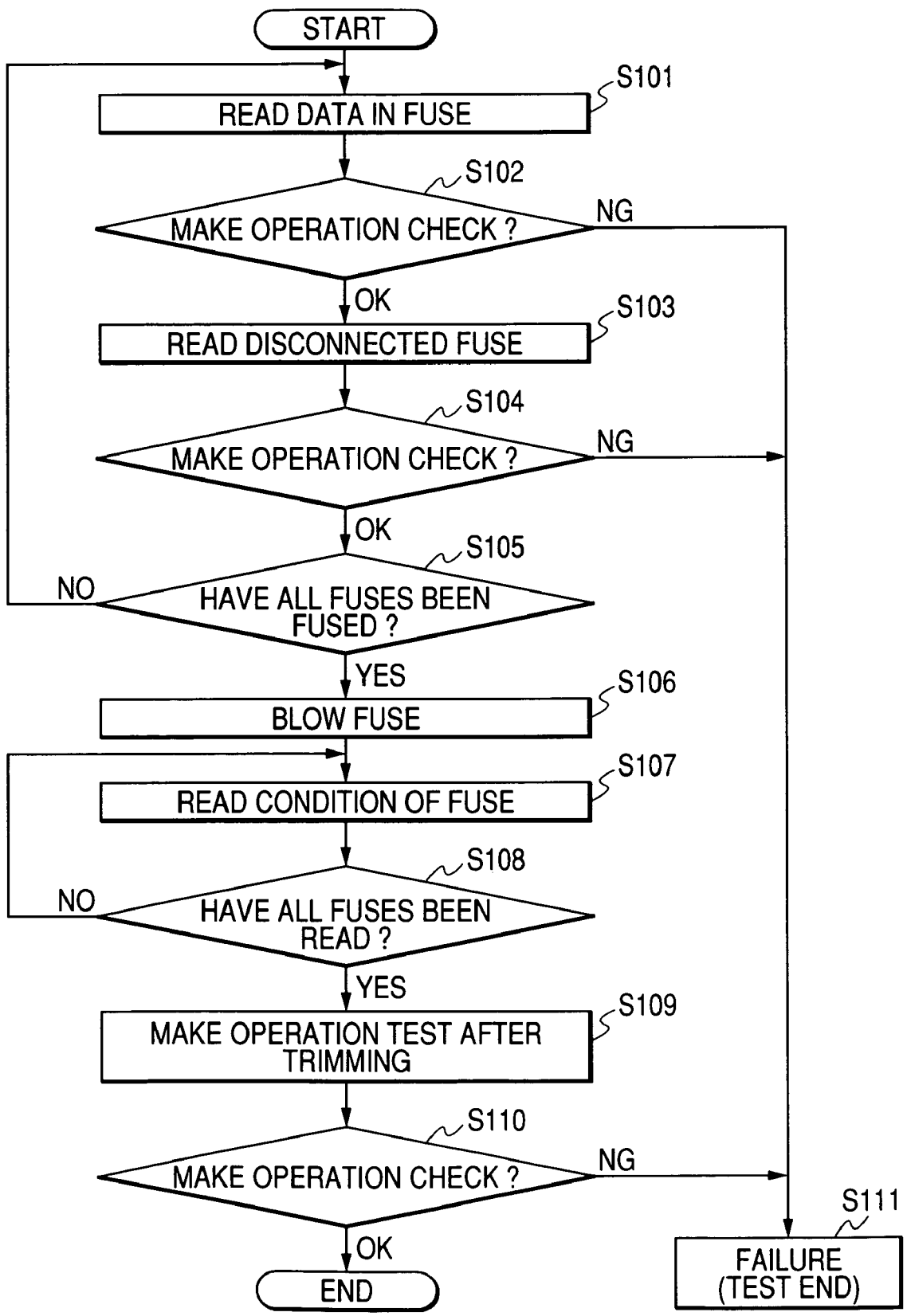
FIG. 3 is a flowchart of an example of the operation of the fuse module of FIG. 2.
Figure 4:
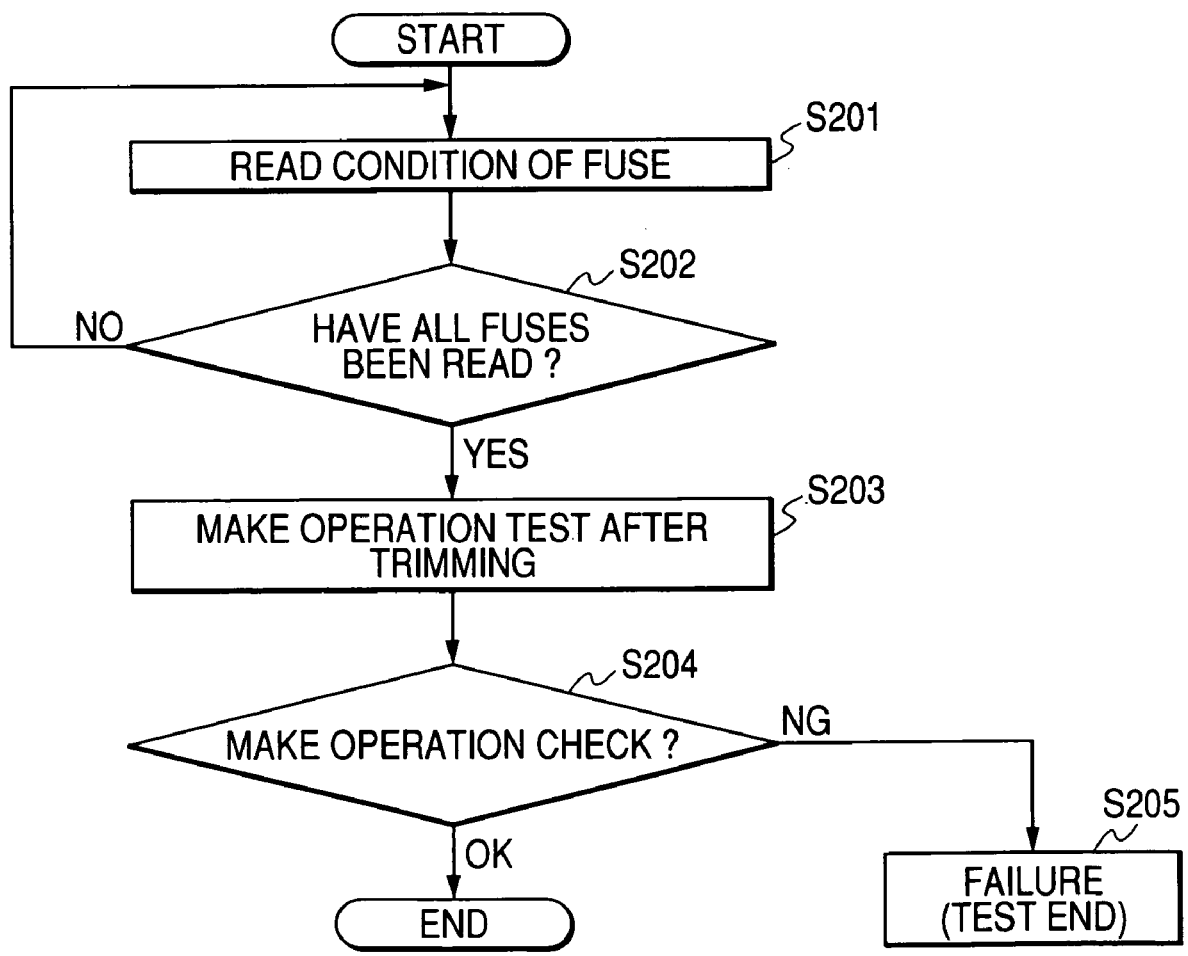
FIG. 4 is a flowchart of an example of the operation of the fuse module in a screening test.

FIG. 1 is a block diagram of a semiconductor integrated circuit 1 according to an embodiment of the invention. FIG. 2 is a block diagram of an example of a fuse module 4 disposed in the semiconductor integrated circuit 1 of FIG. 1. FIG. 3 is a flowchart of an example of the operation of the fuse module 4 of FIG. 2. FIG. 4 is a flowchart of an example of the operation of the fuse module 4 in a screening test.

According to the embodiment, the semiconductor integrated circuit 1 composed of a microcomputer etc. is formed on one semiconductor substrate (semiconductor chip) made of a silicon single crystal or the like by a complementary-metal-oxide-semiconductor-integrated-circuit manufacturing technique.

As shown in FIG. 1, the semiconductor integrated circuit 1 includes a central processing unit (CPU) 2, a random access memory (RAM) 3, a fuse module (control-information holding means) 4, an internal oscillation circuit module 5, a mask read-only memory (ROM) 6, a mode-control circuit 7, an input and output (I/O) port 8, and a peripheral-circuit module 9.

The CPU 2, the RAM 3, the fuse module 4, the internal oscillation circuit module 5, the mask ROM 6, the I/O port 8, and the peripheral-circuit module 9 are connected together via an internal bus 10. The internal bus 10 includes a control-signal bus, an internal address bus, an internal data bus, a peripheral address bus, and a peripheral data bus.

The CPU 2 includes an instruction control section that fetches an instruction, reads the fetched instruction, and generates a control signal; and an executing section that executes computations using an operand in response to the control signal. The mask ROM 6 holds control data and a control program for the CPU 2.

The fuse module 4 stores the control information generated by the CPU 2 and outputs it as trimming information. The internal oscillation circuit module 5 oscillates internally without the need for an external oscillator to generate a clock signal CLK.

The clock signal CLK is used as an operation-reference clock signal when built-in circuit modules are synthesized by clock pulses. Although a typical clock signal CLK is shown here, several kinds of clock signals of different frequencies are actually generated to deal with a case in which the operation speed varies with operation mode, and the clock signals are sent to corresponding circuit modules.

The mode-control circuit 7 is supplied with mode signals MD0 to MD2 and a reset signal RES. When he semiconductor integrated circuit 1 is instructed to be reset by the reset signal RES or the like, the on-chip circuit modules such as the CPU 2 are initialized.

When the reset instruction by the reset signal RES is cancelled, the CPU 2 reads an instruction from a specified start address and starts to execute the program. The start address is determined according to an operation mode indicated by the mode signals MD0 to MD2.

The internal oscillation circuit module 5 includes a control-data register 11, a digital-to-analog (D/A) converter circuit 12 a bias circuit 13, a voltage-controlled oscillator circuit (VCO) 14, a comparator circuit 15, a monitor register 16, a clamp supply circuit 17, a selector 18, and a frequency divider circuit 19.

The control-data register 11 stores control information. The D/A converter circuit 12 converts digital control information loaded on the control-data register 11 to analog data. The bias circuit 13 forms control voltage by reception of the output of the D/A converter circuit 12.

The VCO 14 generates an oscillation of a frequency corresponding to the control voltage. The comparator circuit 15 compares the frequency of an internal clock signal VCLK generated by the VCO 14 with that of an external clock signal RCLK input from the outside.

The monitor register 16 holds the comparison result output from the comparator circuit 15. The clamp supply circuit 17 generates supply voltage for use in conversion reference voltage for D/A conversion. The selector 18 selects the internal clock signal VCLK or the external clock signal RCLK to output it. The frequency divider circuit 19 divides the frequency of the clock signal output from the selector 18 and outputs it as a clock signal CLK.

The selection of the clock signal by the selector 18 is controlled by the mode-control circuit 7. The division ratio of the frequency divider circuit 19 is reset to the initial value, and then made variable through execution of instructions by the CPU 2.

The monitor register 16 doubles as the output register for a clock input signal FNCK that notifies external devices of the completion of frequency-setting operation in frequency-setting mode. The input terminal of the external clock signal RCLK, the output terminal of the clock input signal FNCK, and the output terminal of the internal clock signal VCLK may be either dedicated terminals or multipurpose terminals.

The mode-control circuit 7 loads control information onto the control-data register 11 from the fuse module 4 during initialization (power-on reset operation). When the operation mode designated by the mode signals MD0 to MD2 is a frequency-setting mode, the selector 18 selects the external clock signal RCLK when the reset is cancelled, so that the CPU 2 executes a frequency-setting program in synchronization with a clock signal CLK based on the external clock signal RCLK.

Control voltage is formed on the basis of the D/A conversion output from the D/A converter circuit 12 according to the control information initialized in the control-data register 11, by which the oscillation frequency of the VCO 14 is determined.

The CPU 2 determines whether the comparison by the comparator circuit 15 results in agreement by regularly referencing to the monitor register 16, wherein when it results in disagreement, the CPU 2 accesses the control-data register 11 to update the control information so that the frequency of the internal clock signal agrees with that of the external clock signal.

When it is determined that the comparison result is agreement, the CPU 2 stores the control information in the control-data register 11 into the fuse module 4 and terminates the execution of the frequency-setting program. For termination of the execution of the frequency-setting program, the CPU 2 outputs a clock-input termination signal FNCK to an external unit via the monitor register 16. In response to that, the external unit stops the generation of the external clock signal RCLK.

When the operation mode designated by the mode signals MD0 to MD2 is normal mode, the selector 18 selects an internal clock signal when the reset is cancelled. The control information obtained in a frequency-setting mode and stored in the fuse module 4 is loaded to the initial state in the control-data register 11 at the time of power-on reset. Accordingly, upon cancellation of the reset, the VCO 14 can execute oscillating operation according to the control information obtained in the frequency-setting mode, allowing data processing of the semiconductor integrated circuit 1 in synchronization with the clock signal CLK specified by the internal clock signal VCLK.

Since the control information stored in the fuse module 4 is loaded in the control-data register 11 for reuse, the internal clock signal VCLK of the same target frequency as that of the external clock signal RCLK can be generated every time only by the internal oscillation circuit module 5.

In other words, even when the oscillation frequency of the VCO 14 generates an error due to variations of the process, the VCO 14 can provides oscillation of a target frequency without the need for an external quartz oscillator or the input of an external clock signal. Briefly, fluctuations in oscillation characteristic (fluctuations in oscillation frequency) due to the variations of the process can be compensated.

When the operation mode designated by the mode signals MD0 to MD2 is a first mode at the cancellation of reset, the selector 18 selects an external clock signal; when the operation mode is a second mode, the selector 18 selects an internal clock signal.

FIG. 2 is an explanatory diagram of an example of the fuse module 4.

As shown in the drawing, the fuse module 4 includes a reference fuse circuit (reference-information output section) 20, information-writing fuse circuits (control-information writing sections) $20_1$ to $20_n$, a current-to-voltage converter section (control-information output section) 21, and a register (storage) 22.

The reference fuse circuit 20 includes a reference fuse 23 and an N-channel MOS transistor 24. The information-writing fuse circuit $20_1$ (to $20_n$) includes an information-writing fuse 25, a protective diode 26, and an N-channel MOS transistor 27.

The information-writing fuse circuits $20_1$ to $20_n$ are disposed by the number equivalent to the number of bits of control information required for trimming. For example, for 8-bit control information, eight information-writing fuse circuits are provided.

The current-to-voltage converter section 21 includes current-limiting resistors 28 and 29, current-to-voltage converter circuits 30 and 31, and a sense amplifier 32.

A first connection of the reference fuse 23 connects to a reference potential VSS; a second connection of the reference fuse 23 connects to a first connection of the transistor 24. To the first connection of the transistor 24 is connected a first connection of the resistor 28.

A first connection of the information-writing fuse 25 in the information-writing fuse circuit $20_1$ (to $20_n$) connects to the reference potential VSS.

A second connection of the information-writing fuse 25 connects to a first connection of the transistor 27, the cathode of the protective diode 26, and a voltage-applying pad 33 formed in a scribed area SA of the semiconductor chip.

The anode of the protective diode 26 connects to the reference potential VSS. A second connection of the transistor 27 connects to a first connection of the resistor 29.

The gate of the transistor 24 is connected so that a fuse control signal (second control signal) FC1 output from the CPU 2 is input. The gate of the transistor 27 of each of the information-writing fuse circuit $20_1$ to $20_n$ is connected so that a fuse control signal (first control signal) FC2 output from the CPU 2 is input similarly.

The transistor 24 is turned on and off by the fuse control signal FC1. The transistor 27 of the information-writing fuse circuit $20_1$ (to $20_n$) is turned on and off by the fuse control signal FC2.

A second connection of the resistor 28 connects to the input of the current-to-voltage converter circuit 30. The current-to-voltage converter circuit 30 converts a current flowing in the information-writing fuse 25 to voltage. A second connection of the resistor 29 connects to the input of the current-to-voltage converter circuit 31. The current-to-voltage converter circuit 31 converts a current flowing in the information-writing fuse 25 to voltage.

The output of the current-to-voltage converter circuit 30 connects to a negative (−) input terminal of the sense amplifier 32. The output of the current-to-voltage converter circuit 31 connects to a positive (+) input terminal of the sense amplifier 32. The sense amplifier 32 compares the voltages output from the current-to-voltage converter circuits 30 and 31 and outputs the comparison result.

The output of the sense amplifier 32 connects to registers 22 of the same number as that of the information-writing fuse circuits $20_1$ to $20_n$. The registers 22 are controlled by a register control signal RC output from the CPU 2.

Owing to sharing of the reference fuse circuit 20 and the current-to-voltage converter section 21 by the information-writing fuse circuits $20_1$ to $20_n$, the circuit area occupied by the fuse module 4 can be greatly reduced.

The operation of the fuse module 4 according to the embodiment will then be described.

An example of the operation of the operation test, information writing, and reading by the fuse module 4 executed in probe testing will first be described with reference to the flowchart of FIG. 3.

First, the transistor 24 of the reference fuse circuit 20 is turned on according to the fuse control signal FC1, and the transistor 27 of the information-writing fuse circuit $20_1$ is turned on according to the fuse control signal FC2. Thus the date of the information-writing fuse 25, which is not blown, is read, and the read data is stored in the register 22 (step In this case, for example, when the transistor 24 of the reference fuse circuit 20 and the transistor 27 of the information-writing fuse circuit $20_1$ are turned on, a current flowing in the reference fuse 23 of the reference fuse circuit 20 and a current flowing in the information-writing fuse 25 of the information-writing fuse circuit $20_1$ are converted to voltage by the current-to-voltage converter circuits 30 and 31, respectively.

The voltages output from the current-to-voltage converter circuits 30 and 31 are compared by the sense amplifier 32, and the comparison result is stored in the register 22.

Subsequently, it is determined whether normal data has been stored in the register 22 to detect the presence or absence of abnormality in the information-writing fuse 25 of the information-writing fuse circuit $20_1$ (for example, a break due to a failure in manufacturing process) (step S102). When an abnormality is found in the process of step S102, it is determined to be abnormal, and the test mode is terminated (step S111).

On the other hand, when no abnormality is found in the process of step S102, the transistor 27 of the information-writing fuse circuit $20_1$ is turned off according to the fuse control signal FC2 to disconnect the information-writing fuse 25 equivalently, and reads the data of the information-writing fuse 25 in the information-writing fuse circuit $20_1$ and stores it in the register 22 (step S103).

It is determined whether the information-writing fuse 25 has been blown when the transistor 27 is turned off (step S104). When the information-writing fuse 25 has not been blown, it is determined to be abnormal in step S104, and the test mode is terminated (step S111).

On the other hand, when the information-writing fuse 25 is determined to be blown in the process of step S104, the processes in steps S101 to S104 are executed also for the remaining information-writing fuse circuit $20_2$ to $20_n$ (step S105).

Subsequently, the internal oscillation circuit module 5 is tested for operation with the fuse module 4 in standby mode; control information for trimming is determined; and the necessity/unnecessity for blowing of the information-writing fuse 25 in the corresponding information-writing fuse circuits $20_1$ to $20_n$ is determined.

Then the information-writing fuse 25 in the information-writing fuse circuit $20_1$ is blown on the basis of the control information determined by the operation test for the internal oscillation circuit module 5 (step S106).

For example, to blow the information-writing fuse 25 in the information-writing fuse circuit $20_1$, the transistor 27 is turned off according to a low-level fuse control signal FC2, and a blowing voltage (e.g., about 9 V) is applied to the voltage-applying pad 33 formed in the scribed area SA; thus, the information-writing fuse 25 is blown.

Upon completion of the process in step S106, the condition (blown or unblown) of the information-writing fuse 25 in the information-writing fuse circuit $20_1$ is read, and stored in the register 22 (step S107).

The processes of steps S106 and S107 are executed also for the information-writing fuses 25 in the remaining information-writing fuse circuits $20_2$ to $20_n$ (step S108).

When the information-writing fuses 25 of all the information-writing fuse circuits $20_2$ to $20_n$ have been processed, trimming for the internal oscillation circuit module 5 is executed using the control information stored in the register 22; the internal oscillation circuit module 5 is tested for operation (step S109); and it is determined whether the internal oscillation circuit module 5 satisfies oscillation accuracy (step S110).

When the internal oscillation circuit module 5 satisfies the oscillation accuracy, the test mode is terminated; when the oscillation accuracy is not satisfied, it is determined to be a failure, and the test mode is terminated (step S111)

The operation of the fuse module 4 in a user mode that is executed during a screening test after the assembly of semiconductor integrated circuit will then be described with reference to the flowchart of FIG. 4.

First, the condition (blown or unblown) of the information-writing fuses 25 in the information-writing fuse circuits $20_1$ to $20_n$ is read (step S201).

For example, to read the information-writing fuse 25 in the information-writing fuse circuit $20_1$, the transistor 24 of the reference fuse circuit 20 and the transistor 27 of the information-writing fuse circuit $20_1$ are turned on by the fuse control signals FC1 and FC2, respectively.

Currents flowing in the reference fuse 23 and the information-writing fuse 25 are converted to voltage by the current-to-voltage converter circuits 30 and 31, respectively. The voltages output from the current-to-voltage converter circuits 30 and 31 are compared by the sense amplifier 32, and the comparison result is stored in the register 22.

The process of step S201 is executed also for the information-writing fuses 25 in the remaining information-writing fuse circuits $20_2$ to $20_n$ (step S202). Subsequently, trimming for the internal oscillation circuit module 5 is executed using the control information stored in the register 22; the internal oscillation circuit module 5 is tested for operation (step S203); and it is determined whether the internal oscillation circuit module 5 satisfies oscillation accuracy (step S204).

When the internal oscillation circuit module 5 satisfies the oscillation accuracy, the screening of the fuse module 4 in the user mode is terminated; when the oscillation accuracy is not satisfied, it is determined to be a failure, and the screening is terminated (step S205).

Thus, according to the embodiment, the circuit area of the fuse module 4 can be reduced. Accordingly, the semiconductor integrated circuit can be made compact while the internal oscillation circuit module 5 is increased in oscillation accuracy.

While the invention has been specifically described in its preferred embodiment, it is to be understood that the invention is not limited to that, but various modifications can be made without departing from the spirit and scope thereof.

For example, the embodiment has been described for the case in which the fuse module is used for trimming an oscillation signal in the internal oscillation-circuit module; however, it may also be used to execute trimming for general analog circuits in a semiconductor integrated circuit, such as a supply circuit and a reference voltage circuit for generating a reference voltage of an A/D converter.

The fuse module according to the invention can be used not only in analog circuits but also for relief signals used in relief circuits in semiconductor memories, such as RAMs or ROMs.

The invention is suitable for a technique for minimizing a trimming circuit in an analog circuit disposed in a semiconductor integrated circuit.

What is claimed is:

1. A semiconductor integrated circuit including a control-information holding module that holds arbitrary bits of control information, wherein
   the control-information holding module includes:
   a control-information writing section that arbitrarily outputs the control information written for each bit in response to a first control signal;
   a reference-information output section that outputs reference information in response to a second control signal;
   a control-information output section that compares the control information for each bit output from the control-information writing section to the reference information output from the reference-information output section to determine for each bit whether the control information is at a low level or a high level, and outputs the comparison result; and
   a storage section that stores the control information output from the control-information output section.

2. The semiconductor integrated circuit according to claim 1, wherein
   the control-information writing section includes:
   control-information-writing fuses provided by the number equivalent to the bits of the control information, for writing the control information; and
   a first switching element provided for each of the control-information-writing fuses and connected between the control-information-writing fuses and the control-information output section, for switching in response to the first control signal; and
   the reference-information output section includes:
   a reference fuse for determining whether control information has been written to the control-information-writing fuses; and a second switching element connected between the reference fuse and the control-information output section, for switching in response to the second control signal.

3. The semiconductor integrated circuit according to claim 2, wherein
the control-information-writing fuses and the reference fuse include a blow fuse that is blown by application of voltage.

4. The semiconductor integrated circuit according to claim 1, wherein
the control-information output section includes:
a first current-to-voltage converter section that converts a current flowing in the control-information-writing fuses of the number equivalent to the arbitrary bits to voltage;
a second current-to-voltage converter section that converts a current flowing in the reference fuse to voltage; and
a comparing section that compares the levels of the voltages converted by the first and second current-to-voltage converter sections, and outputs the comparison result.

5. The semiconductor integrated circuit according to claim 1, wherein
the storage section is a register accessible by a central processing unit.

6. The semiconductor integrated circuit according to claim 1, wherein
the control information held by the control-information information holding module is used as a trimming signal for an oscillation circuit that generates an internal clock signal.

* * * * *